United States Patent [19]

Pozzo et al.

[11] Patent Number: 4,642,802

[45] Date of Patent: Feb. 10, 1987

[54] ELIMINATION OF MAGNETIC BIASING USING MAGNETOSTRICTIVE MATERIALS OF OPPOSITE STRAIN

[75] Inventors: William M. Pozzo, North Easton; John L. Butler, Marshfield, both of Mass.

[73] Assignee: Raytheon Company, Lexington, Mass.

[21] Appl. No.: 682,023

[22] Filed: Dec. 14, 1984

[51] Int. Cl.[4] .......... H04R 15/00; H01L 41/06

[52] U.S. Cl. .......... 367/168; 367/156; 310/26

[58] Field of Search .......... 310/26; 367/156, 158, 367/159, 168, 175; 73/DIG. 2

[56] References Cited

U.S. PATENT DOCUMENTS

| | | | |
|---|---|---|---|
| 2,775,749 | 12/1956 | Sussman | 367/168 X |
| 2,947,888 | 8/1960 | Harris | 310/26 |
| 3,207,958 | 9/1965 | Chang | 310/26 X |
| 3,217,218 | 11/1965 | Steele | 310/26 |
| 3,349,304 | 10/1967 | Wachter | 310/26 X |
| 3,353,040 | 11/1957 | Abbott | 367/168 X |
| 3,406,302 | 10/1968 | Lanyi et al. | 367/168 X |
| 4,158,368 | 6/1979 | Clark | 310/26 X |
| 4,432,080 | 2/1984 | Wardle | 310/26 X |
| 4,438,509 | 3/1984 | Butler | 310/26 X |

FOREIGN PATENT DOCUMENTS

| | | | |
|---|---|---|---|
| 265335 | 3/1970 | U.S.S.R. | 310/26 |

*Primary Examiner*—Charles T. Jordan
*Assistant Examiner*—Brian S. Steinberger
*Attorney, Agent, or Firm*—Martin M. Santa; Richard M. Sharkansky

[57] ABSTRACT

The transducer of this invention provides a one-to-one input-to-output frequency relationship by the use of different magnetostrictive materials within the same transducer, the materials each having positive and negative strain expansion coefficients. The materials are selectively driven so that the transducer motion is in one direction for one polarity of the sinusoidal drive signal and in the opposite direction for the other polarity of the drive signal. The resultant transducer is capable of greater peak-to-peak excursion of the radiating face for the same length of magnetostrictive material than in the prior art biased-material transducer.

7 Claims, 12 Drawing Figures

ELIMINATION OF MAGNETIC BIASING USING MAGNETOSTRICTIVE MATERIALS OF OPPOSITE STRAIN

BACKGROUND OF THE INVENTION

Magnetostrictive materials have the property that the strain produced in the material is independent of the magnetizing force polarity applied to the material. Thus, if a sine wave alternating current is applied to a coil wrapped around a bar of positive expansion coefficient magnetostrictive material, the bar will expand to its maximum length at the positive and at the negative peaks of the sine wave to thereby produce a mechanical motion which has a fundamental frequency which is twice that of the frequency of the sine wave providing the magnetizing force. Hence, a DC magnetic bias is required to produce a fixed strain on the magnetostrictive material whereby the application of a superimposed alternating magnetic field causes the magnetic material to increase or decrease its elongation in response to the alternating sine wave magnetomotive force. The magnetic bias therefore results in the magnetostrictive material, when used in an acoustic transducer, producing an acoustic output signal frequency which is the same as the input signal frequency producing the magnetomotive of force. In the absence of biasing, the transducer acoustic output signal frequency is twice the drive frequency which results in low efficiency operation of the transducer. The frequency doubling of unbiased magnetostrictive transducers and the desirability of utilizing biasing is well known to those skilled in the art.

Biasing of the magnetostrictive material is accomplished by either a direct current supply source connected to a coil surrounding the magnetostrictive material or by using permanent magnets in a flux path of which the magnetostrictive material is an element. Permanent magnets are preferred over a direct current source since the permanent magnets eliminate circuit complexity, reduce electrical losses in the winding surrounding the magnetostrictive material, and reduce the size of the wiring and electrical coupling components.

Materials such as nickel and Permalloy, which are easily biased due to their high permeability can use ceramic or Alnico permanent magnets to supply the required bias fields. However, magnetostrictive materials, such as those made of rare earth elements, have a very low permeability and are much more difficult to bias and may involve using costly magnets.

It is therefore an object of this invention to provide a magnetostrictive transducer which does not require biasing in order to produce acoustic output power at the same frequency as that at which it is driven thereby eliminating the cost, bulkiness, circuit complexity and electrical losses associated with bias circuits provided by external direct current supply source or by permanent magnets.

Another object and feature of the invention is to provide a transducer capable of providing twice the peak-to-peak output excursion than is available from a transducer using the same length of biased positive (or negative) magnetostrictive material as in prior art transducers. Biasing of the magnetostrictive material as in the prior art transducers allows a peak-to-peak excursion of the material no greater than the strain change provided by an applied magnetic field from zero to saturation magnetic field. However, by use of two materials of opposite strain coefficient as in this invention, the peak-to-peak excursion is the sum of the strain change from zero to saturation magnetic field obtained from both positive and negative strain coefficient materials. Thus, the peak-to-peak excursion of the transducer of an embodiment of this invention is twice that available from prior art transducers, each having the same length magnetostrictive material.

SUMMARY OF THE INVENTION

The aforementioned problems of magnetostrictive material biasing requirements to provide transducers which operate at the same frequency as the drive frequency are overcome, and other objects and advantages of avoiding biasing are provided by circuitry in accordance with this invention. The invention provides a one-to-one input-to-output frequency relationship by the use of different magnetostrictive materials within the same transducer, the materials each having positive and negative strain expansion coefficients. The materials are selectively driven so that the transducer motion is in one direction for one polarity of the sinusoidal drive signal and in the opposite direction for the other polarity of the drive signal.

BRIEF DESCRIPTION OF THE DRAWINGS

The aforementioned aspects and other features of the invention are explained in the following description taken in conjunction with the accompanying drawings, wherein.

DESCRIPTION OF THE PREFERRED EMBODIMENT

Figure 1:
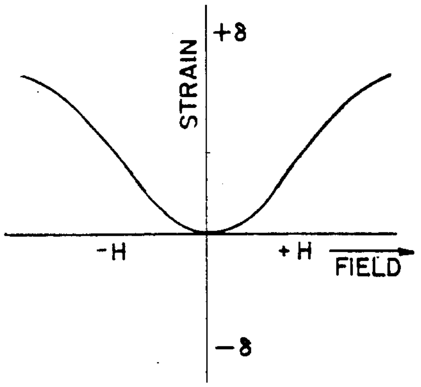
FIGS. 1 and 2 show the strain versus applied magnetic field for magnetostrictive materials having positive and negative strain coefficients, respectively.
Figure 2:
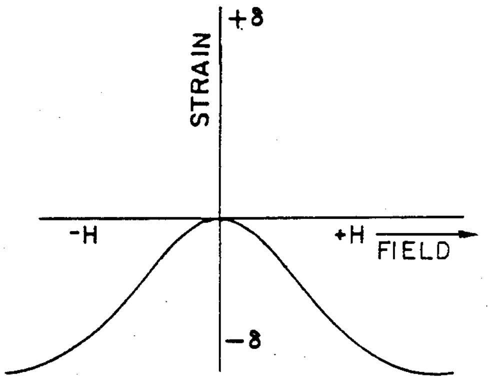

Referring to FIG. 1, there is shown a curve of elongation strain as a function of applied magnetomotive force or magnetic field H for a magnetostrictive material having a positive expansion coefficient ($+\delta$). FIG. 2 shows a curve of contraction strain for a magnetostrictive material having a negative expansion coefficient ($-\delta$) as a function of applied magnetic field. It is noticed that in both plus and negative strain expansion coefficient materials that the material responds with positive and negative strain, respectively, regardless of the applied magnetic field.

Figure 3:
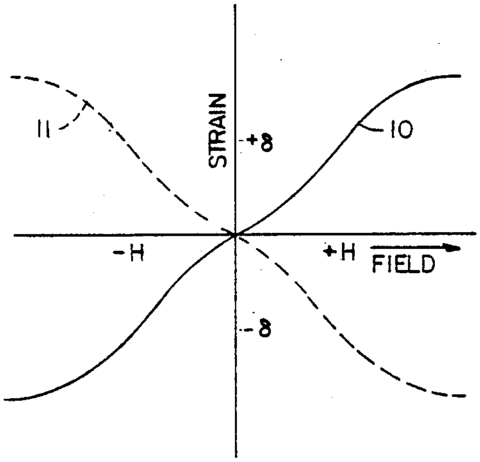
FIG. 3 shows a strain versus applied magnetic field curve where the positive and negative strain coefficient materials have opposite applied magnetic fields, respectively.
Figure 4:
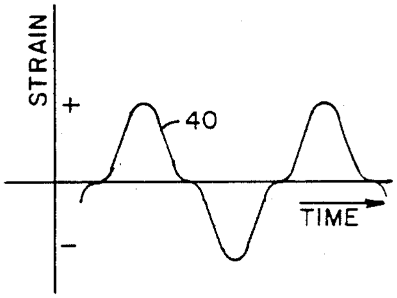
FIG. 4 shows the strain output waveform as a function of time where the driving field is sinusoidal with half-wave drive of the positive and negative strain materials in accordance with this invention.

In order to get a mechanical displacement from a transducer which has the same frequency as the drive frequency, it is desired to fabricate a magnetostrictive circuit which has a strain versus magnetic field response curve such as shown by curve 10 of FIG. 3 (curve 11 is equivalent but differs in that the strain is the negative of that of curve 10 for the same polarity of applied field). For either curve 10 or curve 11 the output waveform 40 of strain as a function of time is shown in FIG. 4 where the H field varies sinusoidally over positive and negative values of magnetic field. It is seen that the output strain is substantially sinusoidal and has the same fundamental frequency as the applied waveform. It is also observed that the available strain of FIG. 3 is twice as great than could be obtained from transducers biased halfway between zero field and saturation field using either the positive or negative materials of FIGS. 1 or 2, respectively.

Figure 5:
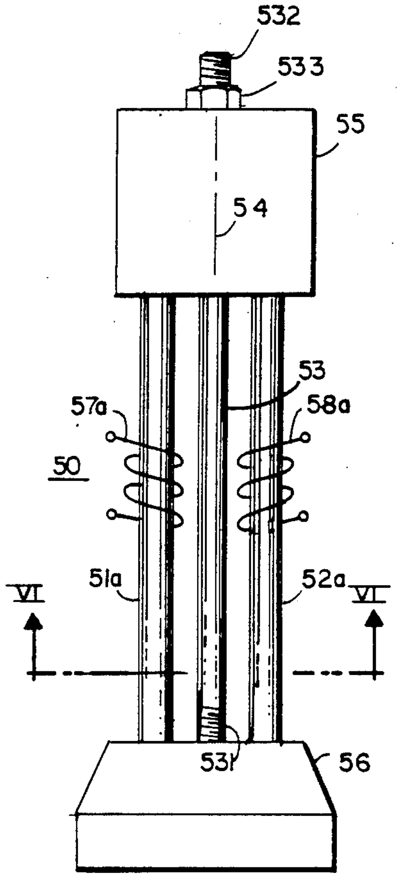
FIG. 5 is a side view of a transducer having a parallel arrangement of positive and negative strain coefficient magnetostrictive bars.

Referring now to FIG. 5, there is shown a side view of a transducer 50 comprising a pair of positive expansion coefficient Terfenol rods 51*a*, 51*b* and a pair of negative expansion coefficient Samarium rods 52*a*, 52*b*. Only one of each pair of rods is shown in the side view of FIG. 5. The rods 51, 52 are located diagonally from one another, respectively, and centered with respect to the stress bolt 53, usually a steel bolt, which is in turn centered upon the axis of symmetry 54 of the tail mass 55 and the head mass 56. In accordance with standard design, the tail mass 55 is of a heavy material such as steel or brass whereas the head mass 56 is of a light material such as aluminum. The choice of the different density materials for the head mass and tail mass are well known to those skilled in the art. Also well known to those skilled in the art is the use of the stress bolt 53 to provide compressive stress upon the magnetostrictive rods 51*a*, 51*b*, 52*a*, 52*b* when the rods are being energized and to tune the resonant frequency of the transducer 50. Bolt 53 is threaded by threads 531 into the head mass 56, passes through a clearance hole (not shown) in tail mass 55 where its threaded end 532 has a nut 533 which adjusts the tension on bolt 53 and thereby the compression of the rods 51, 52.

Figure 6:
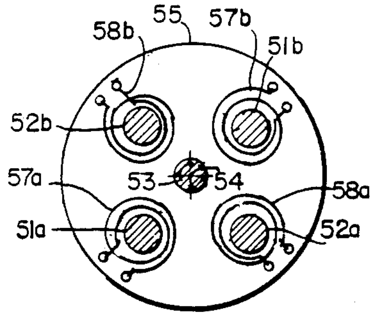
FIG. 6 is a cross-sectional view of FIG. 5 taken along section line VI—VI.
Figure 7:
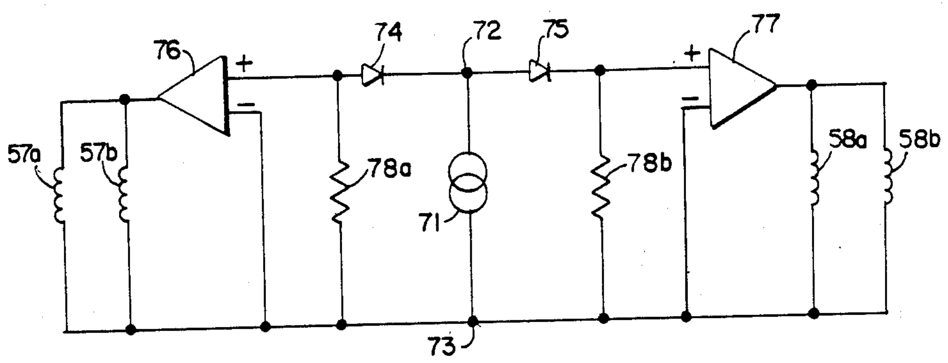
FIGS. 7 and 8 are electrical wiring diagrams for the transducer of FIG. 5 where the magnetizing coils are connected in parallel or serially, respectively.

A cross-sectional view of transducer 50 taken along section lines VI—VI is shown in FIG. 6 which shows the four round magnetostrictive rods 51, 52 centered on axis 54. Energizing coils 57*a*, 57*b*, 58*a*, 58*b* are provided on magnetostrictive rods 51*a*, 51*b*, 52*a*, 52*b*, respectively, to provide magnetomotive force to the rods when electrically connected as shown in FIG. 7. As is well known to those skilled in the art, the transducer 50 is contained within a waterproof container prior to being immersed in a water environment with wires to the coils 57, 58 being brought to the exterior of the container through waterproof connectors.

FIG. 7 shows the electrical wiring arrangement of the coils 57*a*, 57*b*, 58*a*, 58*b* of FIGS. 5 and 6 which allows the transducer 50 to be operated without a direct current magnetic bias in each of the coils. FIG. 7 shows an arrangement wherein one of the parallel coils 58*a*, 58*b* energizes a negative expansion coefficient magnetostrictive rod 52*a*, 52*b*, respectively, of FIG. 5. Similarly, each coil 57*a*, 57*b* energizes a rod 51*a*, 51*b*, respectively, of positive expansion coefficient. A sine wave alternating current source 71 provides current to coils 57*a*, 57*b* only during the time that terminal 72 is negative with respect to terminal 73 because of the polarity assigned to diode 74 connected between source 71 and the windings 57*a*, 57*b*. Diode 75 is connected with the opposite polarity to that of diode 74 so that current flows through windings 58*a*, 58*b* during the half cycle during which terminal 72 is at a positive potential with respect to terminal 73. As a consequence of the diode 74, 75 connections, current flows through windings 58*a*, 58*b* to produce contraction of rods 52*a*, 52*b* during the positive half cycle of alternating source 71 and current flows through coils 57*a*, 57*b* during the negative half cycle of alternating current source 71 to expand bars 51*a*, 51*b*, thereby realizing the strain versus field curve 10 or 11 of FIG. 3 and the strain as a function of time curve 40 of FIG. 4.

It is noted that the polarity of the magnetomotive force applied to, for instance, the positive expansion coefficient material is irrelevant since the material will expand in the positive direction regardless of the polarity of the magnetomotive force. Similarly, the negative expansion coefficient material 51 will contract regardless of the direction of applied magnetomotive force. Therefore, it is recognized that the polarity of each of the diodes 74, 75 may be reversed from that shown in FIG. 7 resulting only in a 180° shift in phase of expansion and contraction relative to the alternating current source.

It should also be observed that the waveform 40 of FIG. 4 showing the strain as a function of time for half cycle excitation of positive and negative magnetostrictive material with a sinusoidal excitation source contains substantial harmonic components. It should be recognized that when the magnetostrictive rods are assembled in transducer 50, the mechanical resonance effect of the transducer results in a movement of the head mass 56 which is substantially sinusoidal with much less harmonic content than that shown in FIG. 4. If the transducer is driven by an alternating current source 71 whose frequency is the natural frequency of the transducer 50, the harmonic content of the head mass movement has been experimentally observed to be less than a few percent.

Figure 8:
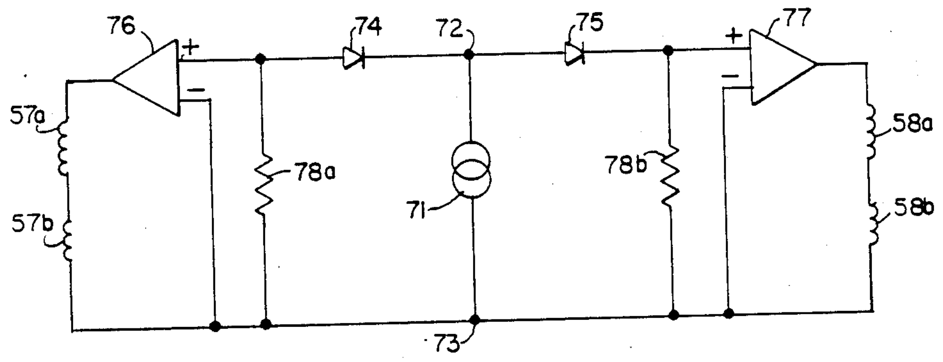

FIG. 8 shows another wiring configuration wherein the windings 57*a*, 57*b*, 58*a*, 58*b* are serially connected, respectively, and each serial connection is connected through its respective diode 74, 75 and amplifiers 74, 75, respectively, to alternator 71. The choice between the electrical circuit of FIG. 7 and FIG. 8 is determined by the voltage and current drive requirements of the windings. The performance of a transducer 50 made in accordance with the wiring diagrams of FIG. 7 and FIG. 8 should be the same.

Because the positive strain and negative strain magnetostrictive rods 51*a*, 51*b*, 52*a*, 52*b* will in general have different strain sensitivity to an applied magnetomotive force the amplitude of the half cycle of current provided by source 71 will in general be different for the positive strain material 51 than for the negative strain material 52. FIGS. 7 and 8 show amplifiers 76, 77 connected respectively to windings 57*a*, 57*b*, 58*a*, 58*b* for this purpose. In general, the amplification of amplifiers 76, 77 will not be the same in order to provide the equal physical displacements of the transducer on the positive and negative half cycles of source 71. Resistors 78*a*, 78*b* at the inputs of amplifiers 76, 77, respectively, provide a termination impedance for the diodes 74, 75 and for the input terminals of the amplifiers 76, 77. Amplifier 76 provides negative half sinusoids to the coils 57*a,* 57*b* whereas amplifier 77 provides positive half sinusoids to the windings 58*a,* 58*b.*

Although FIG. 5 is shown with a symmetrical arrangement of four magnetostrictive rods, opposite rods being positive or negative, respectively, it will be apparent that as few as two rods 51*a,* 52*a* of opposite strain which are located in a plane passing through the axis of symmetry 54 and preferably with the rods at equal distances from the axis 54 is an alternative configuration to that of FIG. 5. The four-rod embodiment of FIG. 5 is preferable because of its greater mechanical stability relative to a two-rod embodiment. Similarly, a potential modification of FIG. 9, discussed later, could have only a pair of serial rods 51*a,* 52*a* and 51*b,* 52*b* in a plane through the central axis 54 and equidistant therefrom.

Figure 10:
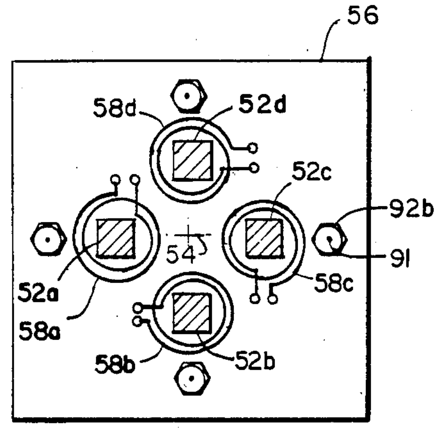
FIG. 10 is a cross-sectional view of FIG. 9 taken along section line X—X.
Figure 9:
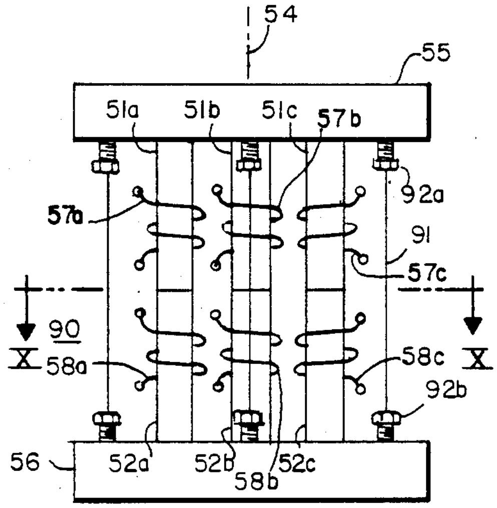
FIG. 9 is a side view of a transducer having serial arrangement of positive and negative strain coefficient magnetostrictive bars.

FIG. 9 shows another version of a tonpiltz type transducer 90 in side view, with a top view taken along section line X—X shown in FIG. 10. The tail mass 55 and the head mass 56 may be fabricated from the same materials as that used in FIG. 5. FIG. 9 is an arrangement where the positive magnetostrictive materials 51*a*–51*d* are physically in series with the negative magnetostrictive materials 52*a*–52*d,* respectively. The serial arrangement of the pairs of rods is preferably symmetrical relative to the axis of symmetry 54. Compressive stress on the serially arranged rods 51, 52 is by using a plurality of tensioned high-strength wires 91 which are secured to tensioning nuts 92*a,* 92*b.* The tension in the wires 91 which are also symmetrically located with respect to one another and the axis of symmetry 54 are adjusted to be equal by rotation of the adjusting nuts 92*a,* 92*b.* The tension of each wire 91 is determined by energizing one or more of the windings 57*a*–57*d,* 58*a*–58*d* at a frequency and adjusting the tensioning nuts 92*a,* 92*b* of each wire 91 until each wire is resonant at that frequency. U.S. Pat. No. 4,438,509, incorporated herein by reference, discloses in detail the wire-tensioning technique for rod compression of FIG. 9. The coils 57*a*–57*d,* 58*a*–58*d* may be connected in parallel, respectively, as shown in FIG. 7, or in series, respectively, as in FIG. 8, or in a series parallel combination (not shown) in order to provide a desired coil impedance.

It should be noted that in either the parallel arrangement of the positive and negative strain rods of FIG. 5 or the serial arrangement of the rods of FIG. 9 that the primary magnetic field produced by the energization of either of their windings should be primarily confined to the rod which is surrounds. Any coupling to the rod of opposite magnetostrictive stress elongation will act to energize such a rod in a direction opposite to the desired direction and hence will reduce the efficiency of the transducers 50, 90. Where the magnetostrictive materials are rare earth rods such as Terfenol or Samarium having low permeability, undesired coupling to the rods will be primarily leakage flux from the driven coil and will be relatively small compared to the flux produced in the rods within each driven coil. It will also be observed in the cross-sectional views of FIGS. 6 and 10 that the rods may be of circular or square cross-section, respectively. In some circumstances, a hexagonal or octagonal cross-section of rods may be a preferable form.

Figure 11:
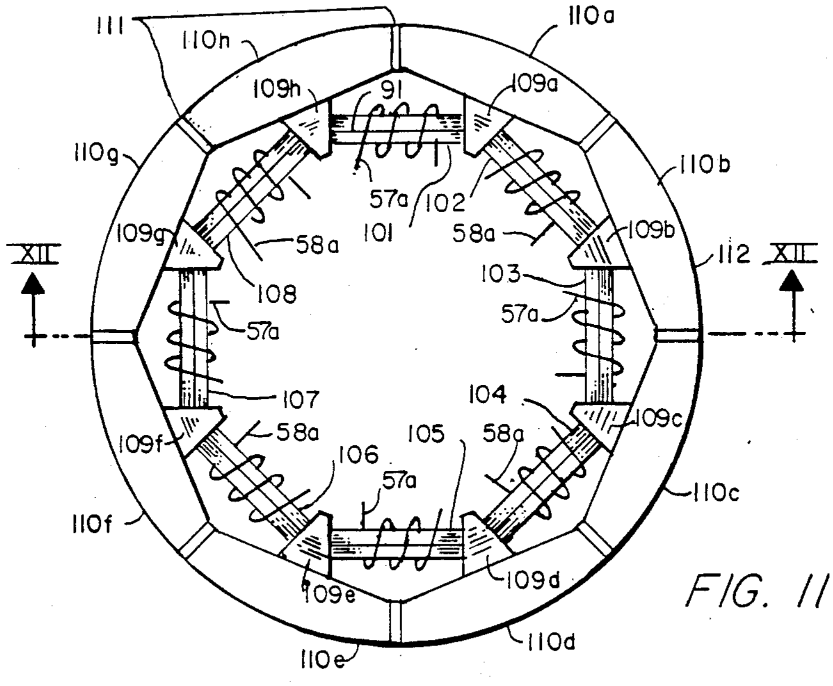
FIG. 11 is a top view of a cylindrical transducer made in accordance with this invention.

This invention may also be applied to a ring-type transducer 100 shown in top view in FIG. 11. One embodiment of the invention would have only one row of magnetostrictive material 101–108. In this event, alternate rods would be of opposite magnetostriction strain coefficients; for example, rods 101, 103, 105 and 107 would be of positive magnetostrictive material and rods 102, 104, 106 and 108 would be of negative magnetostrictive material. Each of the positive magnetostrictive rods have coils 57*a* whereas all the negative magnetostrictive rods have coils 58*a* which may be electrically connected as in FIGS. 7 or 8. As stated earlier, the diodes 74, 75 may each be reversed in polarity without changing the operation of the transducer 90. The rods 101–108 terminate on triangular-shaped blocks 109*a*–109*h* which are in turn rigidly attached to longitudinal cylindrical segments 110*a*–110*h* which are separated from one another by a longitudinally extending encapsulant, such as urethane, for waterproof sealing of segments 110*a*–110*h.* The encapsulant 111 may also be extended to cover the external faces 112 of the cylindrical segments. Tensioning wires 91 are used to place the magnetostrictive rods 101*a*–108*a* in compression as described for FIG. 9. In operation, the cylindrical segments 110*a*–110*h* will move radially inwardly or outwardly in response to the excitation of the rods 101*a*–108*a.*

Figure 12:
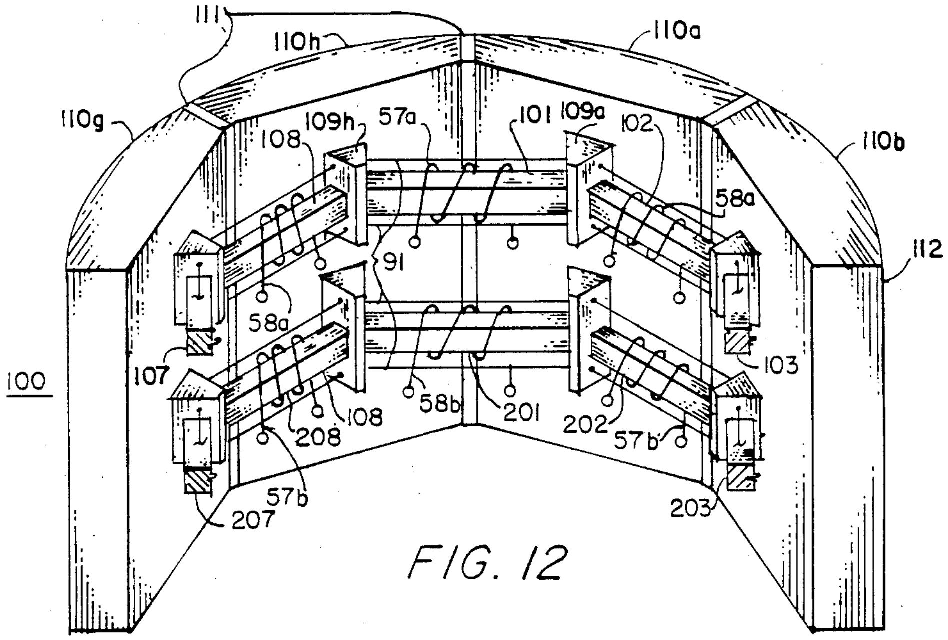
FIG. 12 is a cross-sectional view of FIG. 11 taken along section line XII—XII.

FIG. 12 shows an isometric projection taken along section lines XII—XII of FIG. 11. FIG. 12 shows an embodiment in which there are two rings, magnetostrictive rods 101–108 in one ring and 201–208 in the second ring. As described with reference to FIG. 11, rods 101–108 alternate in the polarity of their magnetostriction strain coefficients, with rod 101*a* being a positive strain coefficient. For this condition existing in FIG. 12, rods 201–208 also alternate in polarity of their magnetostriction strain coefficients with rod 201 having a negative strain coefficient and lies directly below rod 101 which has a positive strain coefficient. Thus, excitation of windings 57*a,* 57*b* on the positive strain rods of both rings will provide a uniform expansion of the cylindrical segments 110*a*–110*h* during one half cycle of the sine wave excitation and the excitation of windings 58*a,* 58*b* on the negative strain coefficient rods of the two rings will cause the uniform contraction of the cylindrical segments 110*a*–110*h* during the other half cycle of the energizing source. The windings 57*a,* 57*b,* 58*a,* 58*b* of FIGS. 11 and 12 may be electrically connected to the source as shown in FIGS. 7 and 8.

It will be apparent to those skilled in the art that there are a number of possible combinations of rings of magnetostrictive rods and their excitation which will produce different radiation patterns from the cylindrical transducer 100 of FIGS. 11 and 12. More specifically, all the rods 101–108 may be of a positive magnetostrictive strain coefficient material and all be excited by windings 57*a,* and the second ring may be comprised of negative magnetostrictive rods 201–208 with each rod being excited by windings 58*a* and wired according to FIGS. 7 or 8. The resulting performance is substantially the same as the two-row configuration of the preceding paragraph.

The electrical and mechanical arrangements of the embodiments in the preceding two paragraphs result in a transducer 100 which produces a omni-directional pressure wave and may be designated a unipolar-type of transducer.

It will also be apparent to those skilled in the art that multi-polar modes of operation of the transducer embodiment of FIGS. 11 and 12 may be achieved by energizing the positive magnetostriction strain coefficient rods lying in a 180° sector of the cylindrical transducer (as shown in FIG. 12) and simultaneously energizing the negative magnetostrictive rods in the other 180° sector of the transducer during the same one-half cycle of source 71; and energizing the negative rods in the 180° sector of FIG. 12 together with the positive rods of the other 180° during the other half-cycle of source 71. To be more specific, the windings of positive strain rods 101, 202, 208 and negative strain rods 104, 106, 205 would be connected to diode 74; whereas the windings of negative strain rods 102, 108, 201 and positive strain rods 105, 204, 206 would be connected to diode 75. Rods 103, 107, 203, 207 are not energized. The resultant behavior of the transducer would be the simultaneous outward motion of cylindrical segments 110*a*, 110*h*, and the inward motion of cylindrical segments 110*d*, 110*e* during one half cycle of the alternating source 71. During the other half cycle, the cylindrical segments 110*a*, 110*h* would move inwardly and the cylindrical segments 110*d*, 110*e* would move outwardly. This would result in a figure eight pattern of radiation of the pressure wave resulting from the dipole mode of operation of the transducer. The remaining cylindrical segments in this dipole mode of operation would be essentially motionless.

Having described a preferred embodiment of the invention it will be apparent to one skilled in the art that other embodiments incorporating its concept may be used. It is believed therefore that this invention should not be restricted to the disclosed embodiment but rather should be limited only by the spirit and scope of the appended claims.

What is claimed is:

1. A transducer comprising:
- a positive strain magnetostrictive material;
- a negative strain magnetostrictive material;
- a tail mass and a head mass;
- means for compressing said positive and negative materials between said tail and head masses;
- means for applying a first magnetomotive force to said positive strain material for first intervals of time;
- means for applying a second magnetomotive force to said negative strain material for second intervals of time;
- said first and second intervals of time alternating and being noncoincident; and
- said head mass undergoing positive and negative movement with respect to said tail mass in response to said first and second magnetomotive forces.

2. The transducer of claim 1 wherein:
- said positive and negative strain magnetostrictive materials are in the form of rods, each rod having its ends on said tail and head masses, respectively;
- said means for applying a first magnetomotive force to said positive strain material for first intervals of time comprising:
- a serial connection of an alternating current source;
- a first diode; and
- first electrical coils around each said positive strain rod to provide current through said first coils during first one-half cycles of said source;
- said means for applying a second magnetomotive force to said negative strain material for second intervals of time comprising:
- a serial connection of said alternating current source;
- a second diode, and second electrical coils around each said negative strain rod to provide current through said second coils during second one-half cycles of said source.

3. The transducer of claim 1 wherein:
- said positive and negative strain magnetostrictive materials are in the form of rods with a positive and negative rod in serial end contact to form a composite rod and the remaining ends of the composite rod in contact with the tail and head masses, respectively;
- said means for applying a first magnetomotive force to said positive strain material for first intervals of time comprising:
- a serial connection of an alternating current source;
- a first diode; and
- first electrical coils around each said positive strain rod to provide current through said first coils during first one-half cycles of said source;
- said means for applying a second magnetomotive force to said negative strain material for second intervals of time comprising:
- a serial connection of said alternating current source;
- a second diode, and second electrical coils around each said negative strain rod to provide current through said second coils during second one-half cycles of said source.

4. A cylindrical transducer comprising:
- a plurality of segments of a cylinder forming the radiating faces of a cylindrical transducer;
- a plurality of positive strain coefficient magnetostrictive bars and a plurality of negative strain coefficient magnetostrictive bars, each bar end terminating on an adjacent cylindrical segment, and each adjacent bar being of the opposite straing from adjacent said bars to form a circular row of alternating positive and negative bars;
- means attached to said segments for mechanically compressing each of said bars;
- an alternating current source;
- means for providing one polarity of half-cycle of said source to the positive strain magnetostrictive bars; and
- means for providing the other polarity of half-cycle of said source to the negative strain magnetostrictive bars.

5. A cylindrical transducer comprising:
- a plurality of segments of a cylinder having an axis forming the radiating faces of a cylindrical transducer;
- a plurality of circular axially displaced rows, each row having alternating positive and negative strain coefficient magnetostrictive bars;
- each bar of a row terminating on an adjacent cylindrical segments;
- each bar of one circular row of bars being of opposite strain polarity from the corresponding bar of another axially displaced row, said corresponding bar terminating on the same cylindrical segments as said each bar;
- means for mechanically compressing each of said bars;
- an alternating current source;
- means for providing one polarity of half-cycle of said source to one strain polarity magnetostrictive bars; and
- means for providing the other polarity of half-cycles of said source to the other strain polarity magnetostrictive bars.

6. A cylindrical transducer comprising:

a plurality of segments of a cylinder having a center axis forming the radiatwng faces of a cylindrical transducer;

a plurality of circular rows of magnetostrictive bars, each bar of a row being of the same one polarity of strain coefficient magnetostriction, adjacent rows of axially displaced rows having bars of opposite strain coefficient;

each bar end terminating on an adjacent cylindrical segment;

means for mechanically compressing each of said bars;

an laternating current source;

means for providing one polarity of half-cycle of said source to rows of bars of one strain polarity; and means for providing the other polarity of half-cycle of said source to rows of bars of the other strain polarity.

7. A cylindrical transducer comprising:

a plurality of segments of a cylinder having an axis of symmetry forming the radiating faces of a cylindrical transducer;

a plurality of axially displaced circular rows of magnetostrictive bars, each bar of of a row being of the same strain coefficient magnetostriction, adjacent rows having bars of opposite strain coefficient;

each bar terminating on adjacent cylindrical segments;

means for mechanically compressing each of said bars;

an alternating current source;

means for providing one polarity of half-cycle of said source to the bars of one strain in one 180 degree sector of one row and to the bars of the opposite strain in the complementary 180 degree sector of a second row of said plurality; and means for providing the other polarity of half cycle of said source to the bars of said one row in the complemcntary 180 degree sector of said one row and to the bars of the opposite strain in the one 180 degree sector of said second row.

* * * * *